(12) United States Patent
Cheng

(10) Patent No.: US 7,388,563 B2
(45) Date of Patent: Jun. 17, 2008

(54) PORTABLE INFORMATION-PROCESSING DEVICE HAVING A COLOR CHANGING CASE

(75) Inventor: Yung-Chien Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 624 days.

(21) Appl. No.: 10/981,704

(22) Filed: Nov. 5, 2004

(65) Prior Publication Data

US 2006/0098395 A1 May 11, 2006

(51) Int. Cl.
*G09G 3/30* (2006.01)
*B32B 19/00* (2006.01)

(52) U.S. Cl. .................. 345/76; 361/683; 428/690

(58) Field of Classification Search .............. 362/154; 345/158, 76; 361/687, 683; 313/512; 428/690, 428/917
See application file for complete search history.

(56) References Cited

U.S. PATENT DOCUMENTS 5,287,244 A * 2/1994 Hileman et al. ............ 361/687

7,227,530 B1 * 6/2007 Yang ......................... 345/158
2001/0046081 A1 * 11/2001 Hayashi et al. ............. 359/296
2004/0156192 A1 * 8/2004 Kerr et al. .................. 362/154

FOREIGN PATENT DOCUMENTS

DE 29708997 U1 * 8/1997

* cited by examiner

*Primary Examiner*—Amr Awad
*Assistant Examiner*—Waseem Moorad
(74) *Attorney, Agent, or Firm*—Birch, Stewart, Kolasch & Birch, LLP

(57) ABSTRACT

A portable information-processing device with a color changing case includes a transparent case covering the device that contains a layer of color-changing electroluminescent film. When the electroluminescent film is subject to different potential level signals, the color of the film changes, so that the color of the case of the portable information-processing device may be altered as desired to increase the visual diversity of the product.

10 Claims, 3 Drawing Sheets

PORTABLE INFORMATION-PROCESSING DEVICE HAVING A COLOR CHANGING CASE

FIELD OF THE INVENTION

The present invention relates to a portable information-processing device and particularly to a portable information-processing device with a color changing case.

BACKGROUND OF THE INVENTION

With the arrival of the information age, information-processing devices are widely used by the general public. The portable information-processing devices (such as notebook computers and the like) have a small size and are easy to carry, and are almost as powerful as the desktop computer, hence have been well received by users in recent years.

These days when consumers buy products they often consider many factors. Besides functional requirements, price and practicality, visual appealing also is an important consideration. The present exterior design of the portable information-processing devices mostly adopts a metal alloy (such as an aluminum magnesium alloy) case to improve the value perception. In addition to enhancing the case structural strength, it also aims to increase the appeal to consumers. The metal case often is colored in black or silver. Although it can enhance the product value perception, the limited exterior color selection becomes a constraint of product diversity.

On mobile communication devices (such as handsets), there are designs for replacing the cases. As the structure of the handset case is simple, users can replace the case of different colors as desired to rekindle their amusement without buying new handsets. Aside from increasing visual diversity of the product appearance, it provides rich choices for fashion-conscious consumers. However, on the portable information-processing devices, the structure of their cases is more complicated. Their cases generally are not designed for user DIY (Do-It-Yourself) disassembly or replacement. Hence how to make the exterior color of the portable information-processing device changeable to increase product visual diversity is an issue remaining to be resolved in the industry.

SUMMARY OF THE INVENTION

In view of the aforesaid disadvantages and problems, the primary object of the present invention is to provide a portable information-processing device with a color changing case. By adding a layer of a color changeable film in a host case, the portable information-processing device may have multiple color alterations on the exterior to increase the visual diversity of the product.

In order to achieve the foregoing object, the portable information-processing device with a color changing case according to the invention includes a host case and a color-changing module.

The host case is made from a colorless and transparent reinforced plastic material and includes an upper shell and a lower shell that are coupled together to form a housing space, to hold a main board and a liquid crystal panel of the portable information-processing device. The upper shell and the lower shell have respectively a laminated space to hold the color-changing module.

The color changing module is located in the laminated space of the host case and made from a color-changing electroluminescent material. When receiving a potential level signal, it can generate a color corresponding to the potential level signal.

In addition, the portable information-processing device with a color changing case according to the invention further includes a color control module linking to the color-changing module to generate a control signal and produce a corresponding potential level signal. The potential level signal is input into the color-changing module to generate a corresponding color thereby to control the exterior color of the portable information-processing device.

The color control module further includes a touch control unit and a temperature sensor. The touch control unit is located on one side of the host case to receive the compression of an external force to generate a piezoelectric potential level signal to be input into the color-changing module for changing the exterior color of the color-changing module. The touch control unit includes a piezoelectric sensor. The temperature sensor is located on one side of the host case to detect the ambient temperature and generate a potential level signal corresponding to the temperature. The potential level signal is put in the color-changing module for changing the exterior color of the color-changing module. The temperature sensor includes a thermistor. The touch control unit further includes a system random color-changing unit to perform a random parameter process and generate a control signal randomly, to enable the color-changing module to change the exterior color randomly.

By means of the portable information-processing device with a color changing case of the invention, a layer of color changing film is added in the transparent host case to generate various colors on the exterior of the portable information-processing device. Thus visual diversity of the product increases.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
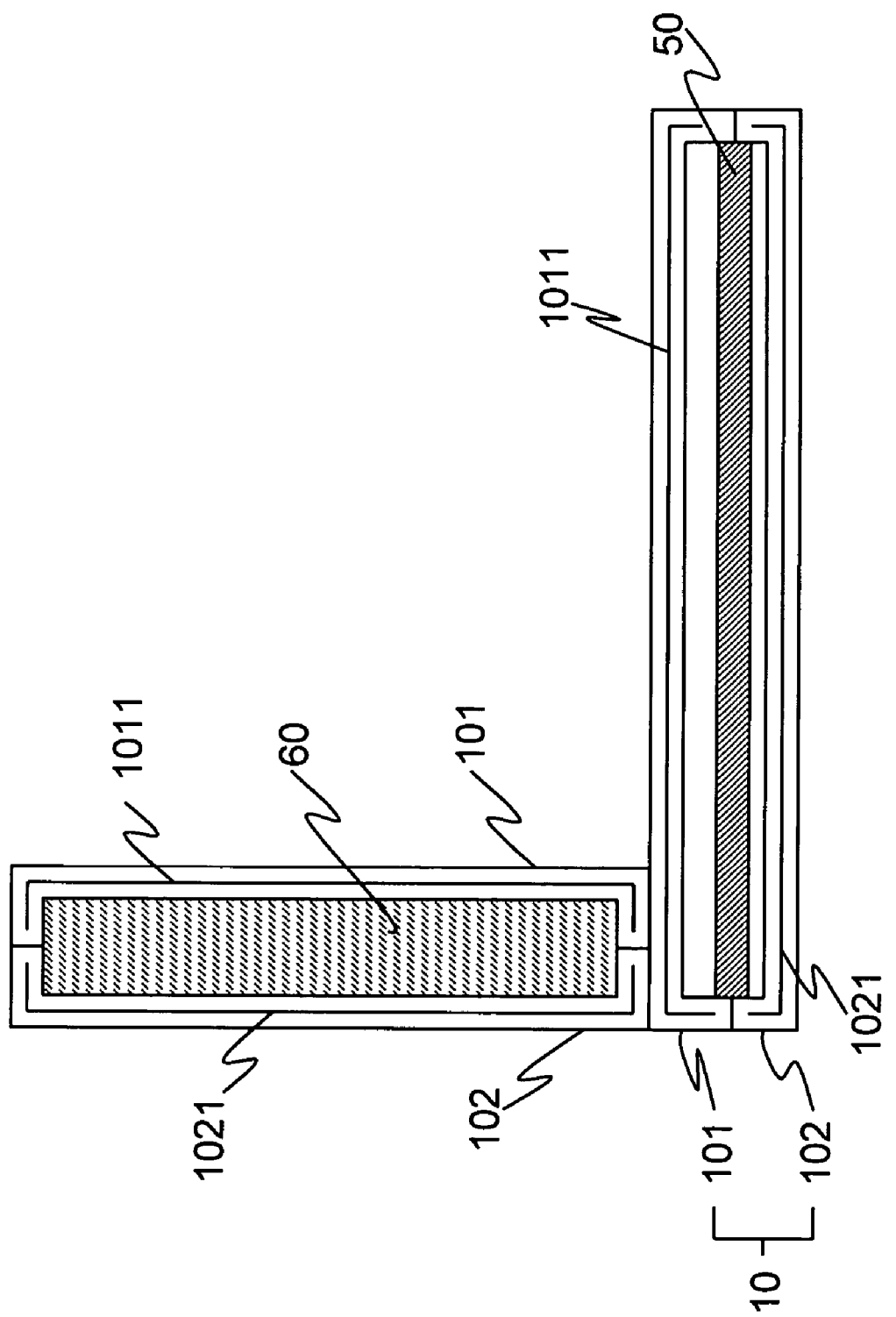
FIG. 1 is a sectional view of the invention.

Refer to FIG. 1 for a sectional view of the invention. A host case 10 is made from a reinforced plastic material that is colorless and transparent. It includes an upper shell 101 and a lower shell 102 that are coupled to form a housing space to hold a main board 50 and a liquid crystal panel 60 of a portable information-processing device. The upper shell 101 and the lower shell 102 have respectively a laminated space 1011 and 1021 for holding a color-changing module 20.

Figure 2:
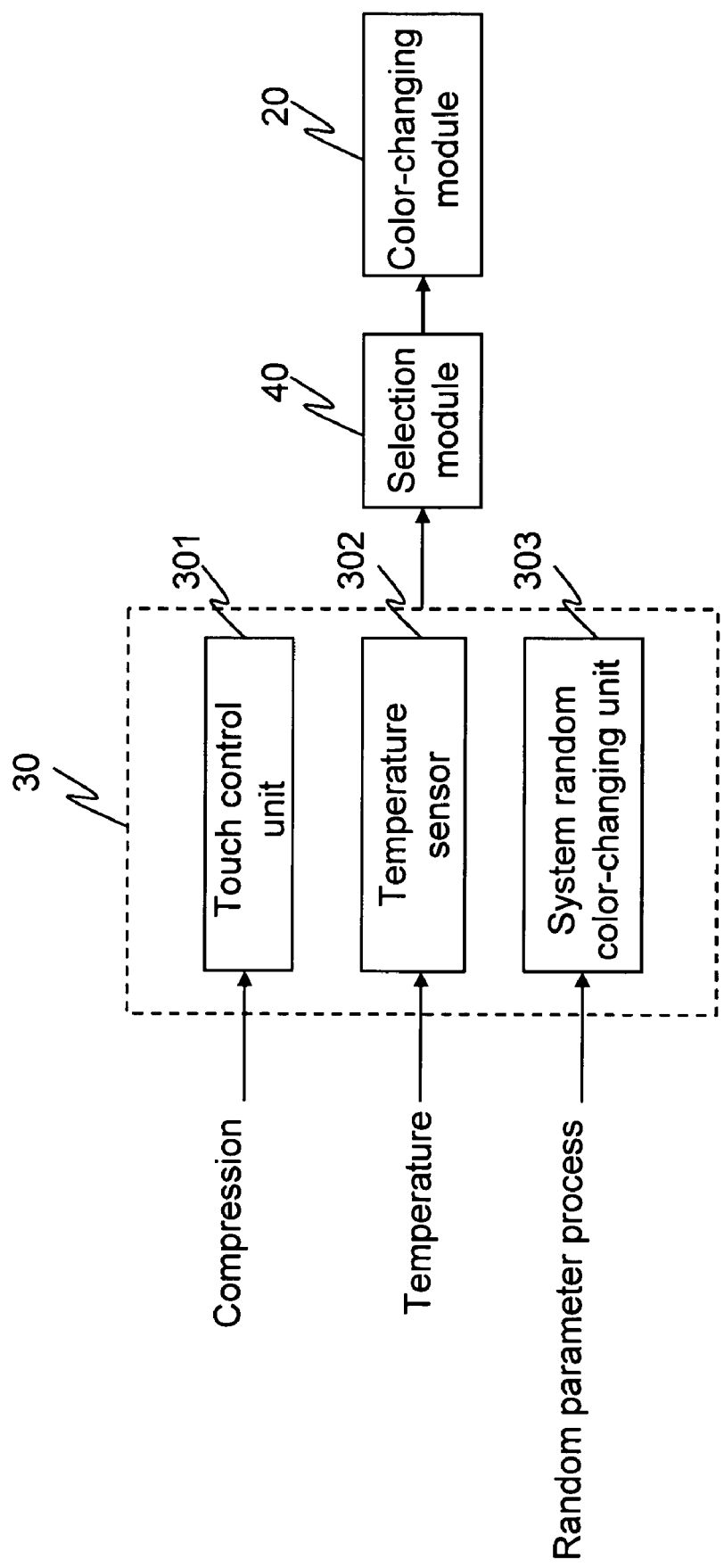
FIG. 2 is a system block diagram of the invention.

Refer to FIG. 2 for the system block diagram of the invention. It includes the color-changing module 20, a color control module 30 and a selection module 40.

The color-changing module 20 is located in the laminated space and is made from a color-changing electroluminescent material that can generate a color corresponding to a potential level signal.

The color control module 30 is connected to the color-changing module 20, to generate a control signal to control the potential level signal put in the color-changing module 20, to enable the color-changing module 20 to generate a corresponding color, thereby, to change the exterior color of the color-changing module 20.

The color control module 30 further includes a touch control unit 301, a temperature sensor 302 and a system random color-changing unit 303. The touch control unit 301 is located on one side of the host case 10 to receive the compression of an external force to generate the control signal. The touch control unit 301 includes a piezoelectric sensor.

The temperature sensor 302 is located on one side of the host case 10 to detect the ambient temperature, and generate a control signal corresponding to the temperature. The temperature sensor 302 includes a thermistor.

The system random color-changing unit 303 aims to perform a random parameter process and generate a control signal randomly to enable the color-changing module 20, to change the exterior color randomly.

The selection module 40 has one end connecting to the color-changing module 20 and another end connecting to the touch control unit 301, temperature sensor 302 and system random color-changing unit 303, to selectively put a potential level signal in the color-changing module 20, thereby, to select a touch control color changing mode, temperature control color changing mode or random color changing mode to change color. The selection module 40 includes a switch.

Figure 3:
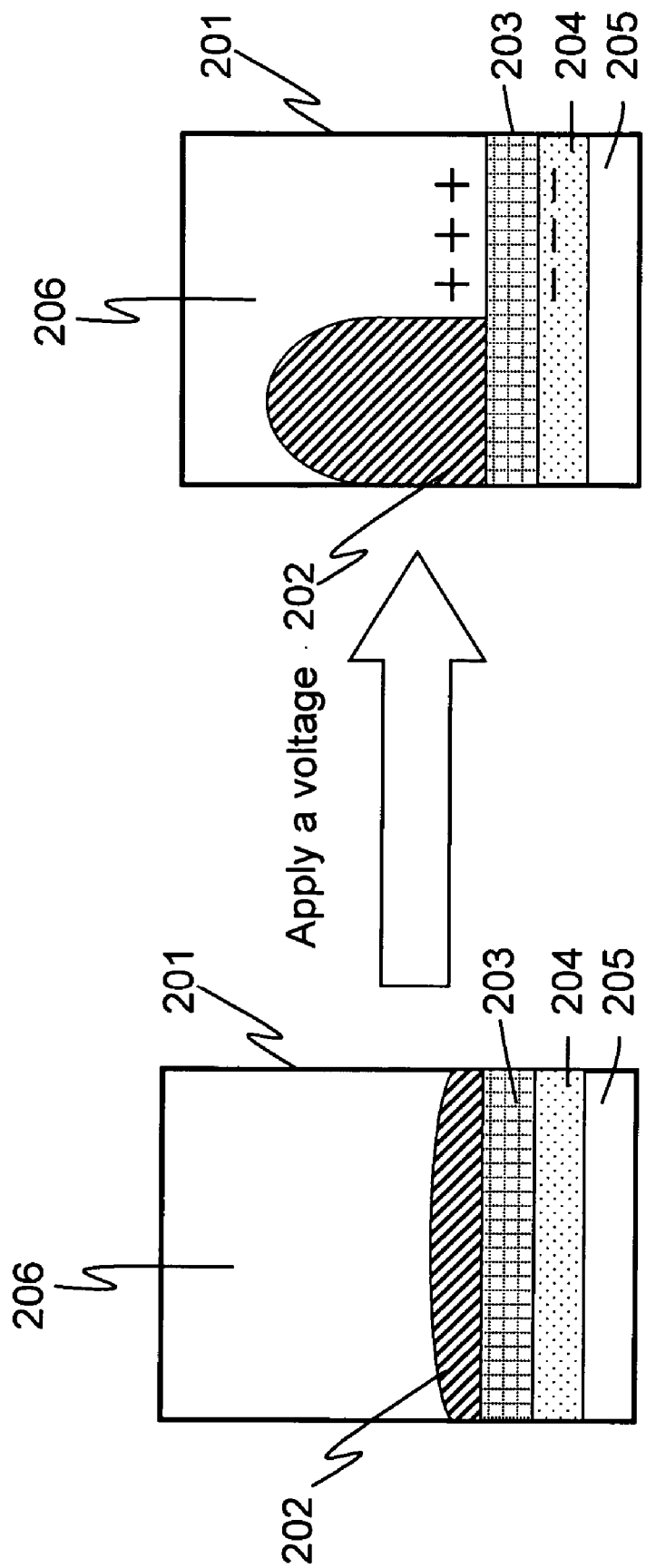
FIG. 3 is a schematic view of the structure of the color-changing electroluminescent material of the invention.

Refer to FIG. 3 for the structure of the color-changing electroluminescent material. The electroluminescent material consists of a plurality of micro containers 201 arranged in a desired layout. Each of the micro containers 201 has white base layer 205 on the bottom, a transparent electrode 204 above the white base layer 205, and a water insulation layer 203 above the transparent electrode 204. The micro containers 201 contain an oil-base pigment 202 and a water layer 206 on the top portion. The oil-base pigment 202 is located between the bottom of the micro container 201 and the water layer 206, to form a flat film. When the transparent electrode layer 204 and the water layer 206 are subject to a voltage, the tension of the contact surface alters, the film is deformed and shrunk and squeezed to one side by the water layer 206, and the white base layer 205 is exposed and the micro container 201 can reflect light to generate a lighter color on the exterior. When the micro container 201 contains the oil-base pigment of different colors, and different potential level signals are put in the transparent electrode 204, the exterior will generate different colors or patterns. As the voltage required to change the color is very low and consumes little electric power, the required power may be supplied by the battery of the portable information-processing device.

By means of the portable information-processing device with a color changing case, the color changing film located in the transparent host case can change color or pattern according to different potential level signals. Hence users can change the appearance of the portable information-processing device any time desired and the visual diversity of the product increases.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A portable information-processing device having a color changing case, comprising:
   a host case made from a colorless transparent material having a housing space to hold a main body of the portable information-processing device, the colorless transparent material having a laminated space; and
   a color-changing module made from a color-changing electroluminescent material housed in the laminated space to generate a selected color corresponding to a potential level signal provided by the portable information-processing device, wherein the color-changing electroluminescent material has a plurality of micro containers, and the micro containers have white base layer on a bottom, a transparent electrode above the white base layer, and a water insulation layer above the transparent electrode and contain an oil-base pigment and a water layer on a top portion.

2. The portable information-processing device of claim 1, wherein the host case includes an upper shell and a lower shell.

3. The portable information-processing device of claim 1 further including a color control module linking to the color-changing module to generate a control signal to control the potential level signal input into the color-changing module to change the color of the color-changing module.

4. The portable information-processing device of claim 3, wherein the color control module includes a touch control unit to receive compression of an external force to generate the control signal.

5. The portable information-processing device of claim 4, wherein the touch control unit includes a piezoelectric sensor.

6. The portable information-processing device of claim 3, wherein the color control module includes a temperature sensor to detect ambient temperature and generate the control signal according to the detected temperature value.

7. The portable information-processing device of claim 6, wherein the temperature sensor is a thermistor.

8. The portable information-processing device of claim 3, wherein the color control module includes a system random color-changing unit to generate the control signal randomly.

9. The portable information-processing device of claim 1 further including a selection module to select the potential level signal input into the color changing module.

10. The portable information-processing device of claim 9, wherein the selection module includes a switch.

* * * * *